United States Patent

Kobayashi et al.

[11] Patent Number: 5,842,120
[45] Date of Patent: Nov. 24, 1998

[54] RADIO RECEIVER WITH PROGRAMMABLE DIGITAL TUNER IMMUNE TO MANUFACTURING VARIATIONS IN VARACTOR CAPACITANCE

[75] Inventors: Keiji Kobayashi; Yasunari Noguchi, both of Gunma-ken, Japan

[73] Assignee: Sanyo Electric Co., Ltd., Osaka, Japan

[21] Appl. No.: 718,820

[22] Filed: Sep. 24, 1996

[30] Foreign Application Priority Data

Sep. 29, 1995 [JP] Japan ............................... 7-253900

[51] Int. Cl.⁶ .................................................. H04G 1/18
[52] U.S. Cl. ............................... 455/179.1; 455/186.1
[58] Field of Search .............................. 455/169.2, 180.3, 455/180.4, 191.2, 193.3, 197.2, 195.1, 161.2, 173.1, 176.1, 179.1, 182.3, 185.1, 189.1, 165.1, 183.3, 186.1

[56] References Cited

U.S. PATENT DOCUMENTS

| | | | |
|---|---|---|---|
| 4,061,982 | 12/1977 | Kawashima | 325/464 |
| 4,128,849 | 12/1978 | Rhee | 358/191 |
| 4,142,157 | 2/1979 | Tanaka | 325/464 |
| 4,152,654 | 5/1979 | Tanaka | 325/459 |
| 4,236,251 | 11/1980 | Ohgishi et al. | 455/180 |
| 4,419,769 | 12/1983 | Cohen | 455/182 |
| 4,794,650 | 12/1988 | Yokoyama | 455/197 |
| 5,212,817 | 5/1993 | Atkinson | 455/161.2 |
| 5,417,661 | 5/1995 | Atkinson | 455/165.1 |
| 5,552,749 | 9/1996 | Nowatski et al. | 331/14 |

FOREIGN PATENT DOCUMENTS

| | | |
|---|---|---|
| 0147518 | 7/1985 | European Pat. Off. . |
| 0601743 | 6/1994 | European Pat. Off. . |
| 0624949 | 11/1994 | European Pat. Off. . |
| 6252705 | 9/1994 | Japan . |

OTHER PUBLICATIONS

European search report dated Dec. 12, 1996 for application serial No. EP 96 30 7110.

*Primary Examiner*—Nguyen Vo
*Assistant Examiner*—Makoto Aoki
*Attorney, Agent, or Firm*—Loeb & Loeb LLP

[57] ABSTRACT

A storing circuit for storing control data for a varactor diode, a frequency divided data generating circuit for generating frequency divided data to set the local oscillating frequency of a local oscillating circuit, a determining circuit for computing a receiving frequency from the frequency divided data and determining whether or not the receiving frequency is within a designated frequency range and an arithmetic circuit for executing computation in compliance with data indicating the receiving frequency and control data stored in the storing circuit are provided, and the capacitance of the variable capacitance element is controlled by analog-conversion of an output signal from the arithmetic circuit, thus tracking errors caused by variation in tuning elements are prevented and an RF tuning circuit control interval is reduced.

10 Claims, 6 Drawing Sheets

RADIO RECEIVER WITH PROGRAMMABLE DIGITAL TUNER IMMUNE TO MANUFACTURING VARIATIONS IN VARACTOR CAPACITANCE

BACKGROUND OF THE INVENTION

1. Field of the Invention

The present invention relates to improvements to a radio receiver for revising RF tuning frequency displacement caused by variation in variable capacity elements.

2. Description of the Prior Art

Radio receivers having a control circuit for generating digital data have conventionally been used for obtaining an optimum reception state by altering the digital data. As a conventional example of such a radio receiver, FIG. 1 shows an AM radio receiver in which both the frequency of a local oscillating signal and the tuning frequency of an RF tuning circuit are controlled in compliance with the output data of a control circuit.

In FIG. 1, a frequency for a received signal RF is selected at an RF tuning circuit (1) and amplified at an RF amplifying circuit (2). A signal outputted from the RF amplifying circuit (2) is converted to a 450 kHz IF signal by a local oscillating signal generated by a local oscillating circuit (4) in a mixing circuit (3) and this IF signal is then amplified by an IF amplifying circuit (5) and AM detected by a detecting circuit (6).

In addition, when the AM radio shown in FIG. 1 selects a desired broadcasting station from the receiving signal, frequency divided data which is outputted from the control circuit (7) for setting the frequency dividing ratio are applied to a programmable divider included in the PLL control circuit (8). Since the local oscillating circuit (4) and a PLL control circuit (8) form a PLL, a local oscillating signal frequency locks onto a frequency in compliance with the divided data. In addition, the local oscillating signal frequency is applied to a mixing circuit (3) and the RF signal of the desired broadcasting station is converted to an IF signal.

The control circuit (7) also applies output data to a variable capacitance element (1a) via a fine-tuning circuit (9), controls the capacitance value at a tuning element consisting of this variable capacitance element (1a) and an inductor element (1b) and coarsely-tunes the tuning frequency. For instance, if all of the AM receiving bands are divided into 13 bands, the control circuit (7) determines within which band the frequency of the desired broadcast station lies based on the divided data and coarsely tunes the RF tuning circuit (1) to a frequency corresponding to that band.

The fine-tuning circuit (9) then commences fine-tuning in compliance with the outputted data and fine-tunes the tuning frequency of the RF tuning circuit (1) at each of minute ranges, for instance at 64 ranges within the band. The receiving field intensity set at each of the tuning frequencies are detected by a field intensity detecting circuit (10) and the control data of the variable capacity element (1a) and data indicating field intensity corresponding thereto are temporarily stored in a storing circuit (11). The control circuit (7) detects the data indicating the maximum field intensity from data stored in the storing circuit (11), and sets the tuning frequency of the RF tuning circuit (1) to a frequency which will have this field intensity. As a result, tracking errors caused by variation of characteristics of the variable capacitance elements which set the tuning frequency of the RF tuning circuit (1) can be prevented.

In the radio receiver shown in FIG. 1 the AM receiving band was divided into a plurality of bands and the tuning frequencies of the RF tuning circuit (1) were coarsely tuned to those bands. However, when the AM band is divided widely, the fine-tuning range widens and a large number of fine-tuning data are required for the variable capacity element (1a) which leads to the problem that fine-tuning takes a long time. In other words, the interval between the commencement and completion of the tuning operation is an important point for the listener and a crucial factor in radio receiver sets. For instance, when an AM receiver band is divided into 13 bands and then the tuning frequency in the RF tuning circuit (1) is fine-tuned by using 6 bits data, the required fine-tuning time is approximately 300 msec.

Alternatively, when the AM band is closely divided in an attempt to reduce the fine-tuning time, if a desired broadcasting station is located near the boundary of the divided band there has been the problem that due to variations in the value of the variable capacitance element (1a) the tuning frequency lies outside the band, thereby causing deterioration in receiving sensitivity. This problem is particularly prevalent when an AM band is closely divided, since this produces a greater number of band boundaries. Although variation in the tuning frequency may be minimized in order to solve this problem, this would newly require the selection of a varactor diode.

SUMMARY OF THE INVENTION

It is the therefore the object of the present invention to solve the problems described, above by preventing the generation of tracking errors caused by variation in a tuning element and also by reducing the time required to execute tuning in an RF tuning circuit.

In order to achieve the abovementioned objectives, a radio receiver of the present invention is provided with an RF tuning circuit which includes a tuning element having a variable frequency characteristic in order to set tuning frequencies, a mixing circuit for converting a signal outputted from the RF tuning circuit to an IF signal by means of a local oscillating signal, a local oscillating circuit for generating the local oscillating signal, a frequency control circuit for controlling a frequency of the local oscillating signal, a storing circuit for storing control data corresponding to the frequency characteristic of the tuning element, an arithmetic unit for carrying out a computation based on the control data and data corresponding to a desired broadcasting station and generating a control signal, and frequency characteristic of the tuning element is controlled by applying the control signal from the arithmetic unit to this tuning element and the tuning element executes tuning so as to correspond to a desired broadcasting station.

A control signal corresponding to the tuning element is thus computed using data corresponding to a desired broadcasting station and control data stored beforehand in the storing circuit. The tuning element is controlled by this control signal and consequently tuning can be carried out in a short time.

In addition, in the abovementioned radio receiver, the arithmetic unit is characterized in that it comprises a determining circuit for determining whether data corresponding to the desired broadcasting station is situated between first control data stored in the storing circuit and second control data greater than the first control data and stored in the storing circuit and an arithmetic circuit for carrying out computation in compliance with the first control data, the second control data and data indicating the desired receiving station in a case in which the data corresponding to the desired broadcasting station has been determined to be situated between the first control data and the second control data.

Furthermore, the tuning element consists of an inductor element and a variable capacitance element, and is characterized in that tuning to correspond to a desired broadcasting station is carried out by controlling the capacitance in compliance with the control signal supplied from the arithmetic unit.

Furthermore, when regulating for the radio receiver, a signal at a designated frequency is supplied to the radio receiver, receiving field intensities in the radio receiver corresponding respectively to the control data are detected while regulating control data are finely tuned, and from these are selected one regulating control data which obtain the greatest receiving field intensity, and then the selected regulating control data is stored in the storing circuit as the control data.

The data spaces between each of the control data are set at narrower interval as variation in the frequency characteristics of the tuning element becomes wider.

Furthermore, frequency spaces between the tuning frequencies are set at narrower variations as the frequency characteristic of the tuning element becomes wider. For instance, the above frequency spaces correspond respectively to each of the control data.

According to another aspect of the present invention, a radio receiver is provided with an RF tuning circuit including a tuning element having variable capacitance in order to set tuning frequencies, a mixing circuit for converting a signal outputted from the RF tuning circuit to an IF signal by means of a local oscillating signal, a local oscillating circuit for generating the local oscillating signal, a frequency control circuit for controlling a frequency of the local oscillating signal, a storing circuit for storing control data corresponding to frequency characteristic based on a capacitance of the tuning element, an arithmetic unit for carrying out a computation based on the control data and data corresponding to a desired broadcasting station and generating a control signal, and the capacitance value of the tuning element is controlled by applying the control signal from the arithmetic unit to this tuning element and the tuning element executes tuning so as to correspond to a desired receiving station.

DESCRIPTION OF THE PREFERRED EMBODIMENT

Figure 1:
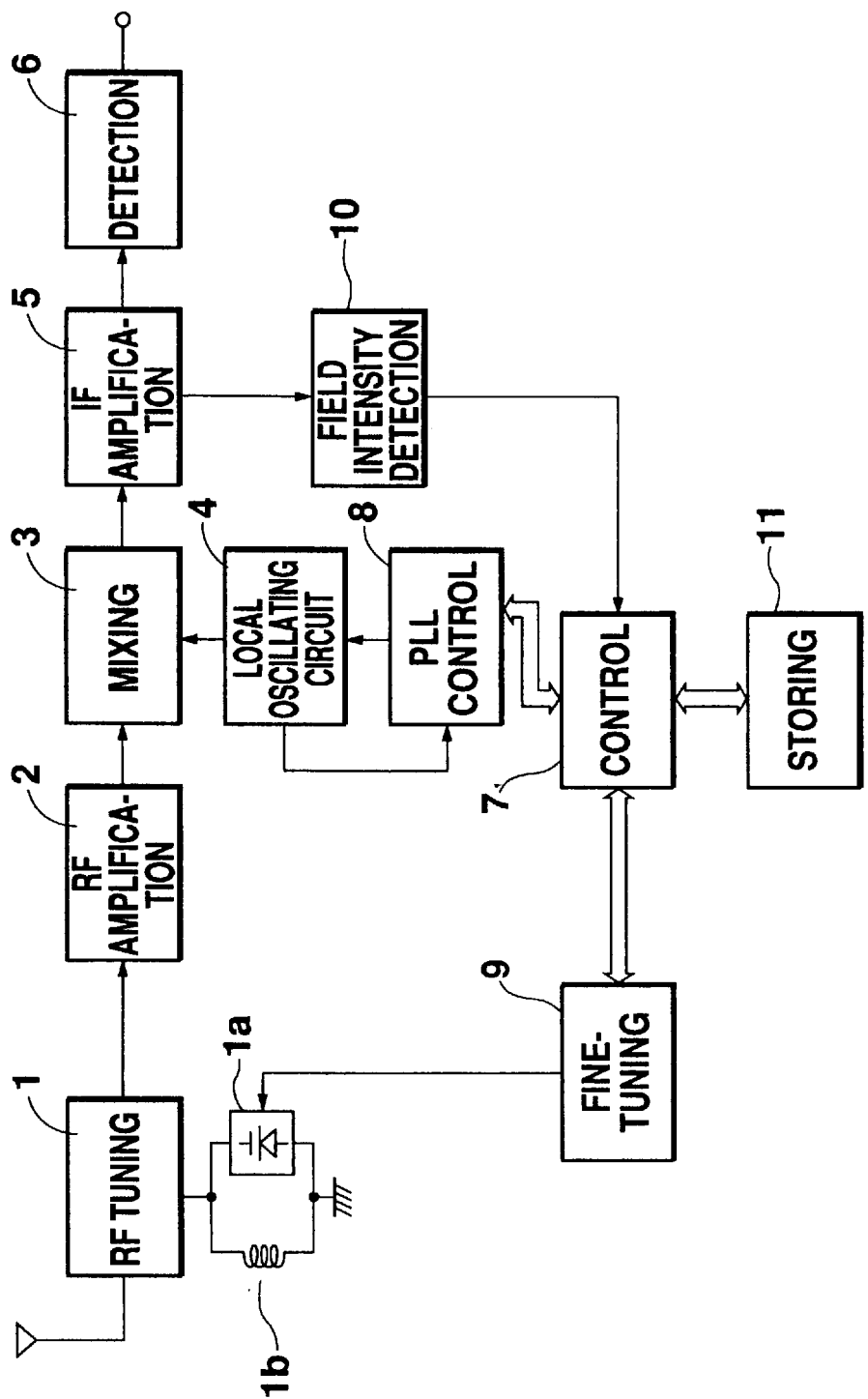
FIG. 1 is a diagram depicting a configuration of a conventional radio receiver.
Figure 2:
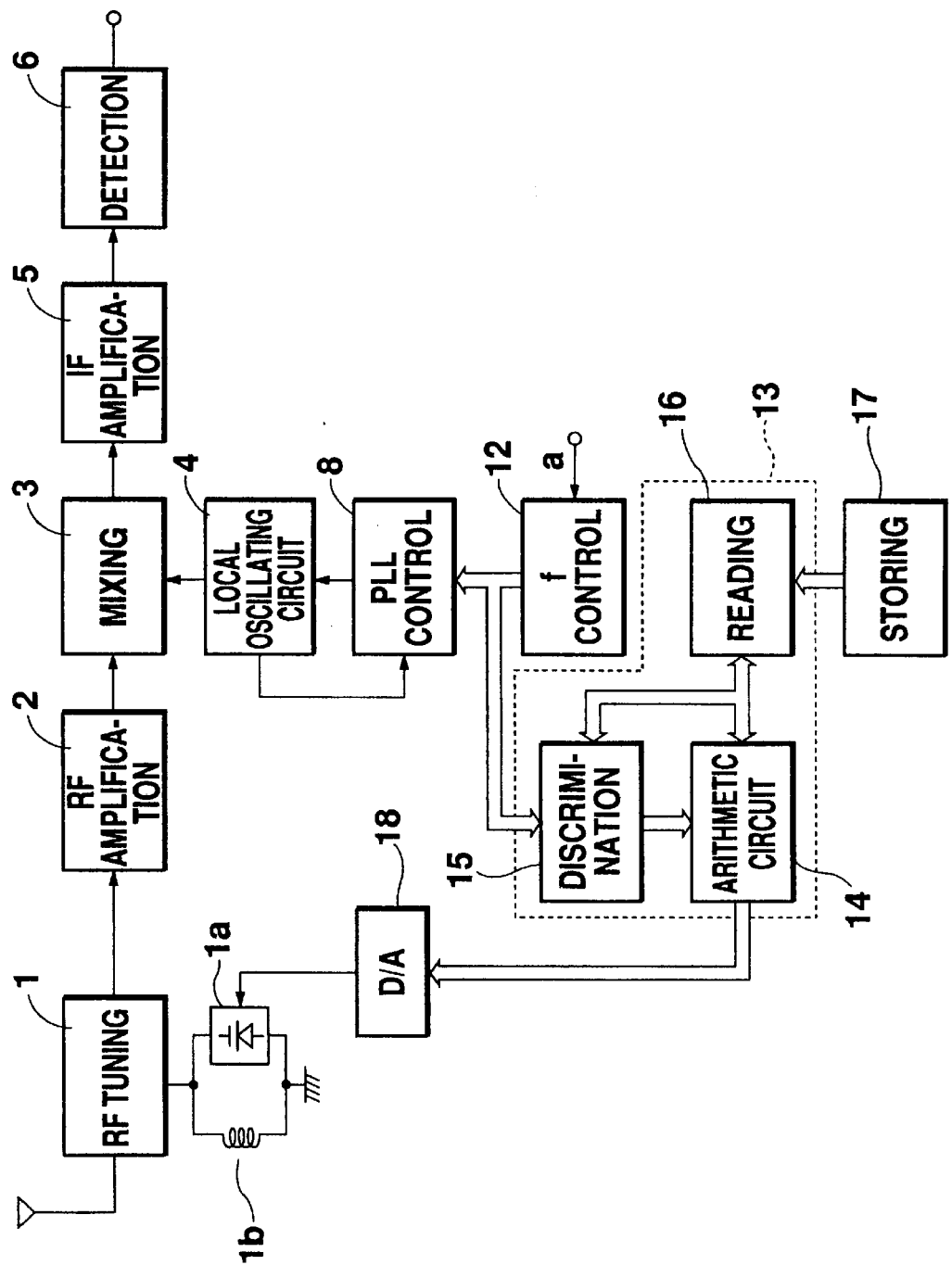
FIG. 2 is a diagram depicting a configuration of a radio receiver in an embodiment of the present invention.

FIG. 2 shows a preferred embodiment of the present invention in which (12) is a frequency divided data generating circuit for generating frequency divided ratio data for a PLL control circuit (8), (13) is an arithmetic unit consisting of an arithmetic circuit (14) for computing on a control signal, a determining circuit (15) for determining whether or not data indicating a desired broadcasting station is within a designated range, a reading circuit (16) for reading and generating control data. (17) is a storing circuit for storing control data in compliance with a designated frequency and (18) is a D/A converting circuit for analog-converting a control signal. Those circuits in FIG. 2 which are identical to the conventional example shown in FIG. 1 have been given the same numbering and an explanation of these circuits is omitted here.

In FIG. 2, when the radio is tuned to a first broadcasting station, in that state, a local oscillating signal generated by a local oscillating circuit (4) forming a PLL together with the PLL control circuit (8) locks onto a frequency corresponding to the divided data and is applied to a mixing circuit (3). Moreover, the variable capacitance element (1a) is controlled in compliance with an output signal from the D/A converting circuit (18) and consequently a tuning element consisting of a variable capacitance element (1a) and an inductor element (1b) are also controlled, the tuning frequency of the RF tuning circuit (1) being nearly equal to the frequency of the first broadcasting station. In this state, the received RF signal is tuned to a tuning frequency set according to the capacitance of the variable capacitance element (1a) in the RF tuning circuit (1) and frequency-selected. Once the signal outputted from the RF tuning circuit (1) has been amplified by an RF amplifying circuit (2) it is mixed with a local oscillating signal from the local oscillating circuit (4) in a mixing circuit (3) and converted to an IF signal. This IF signal is then amplified by an IF amplifying circuit (5) and AM-detected by a detecting circuit (6).

Figure 3:
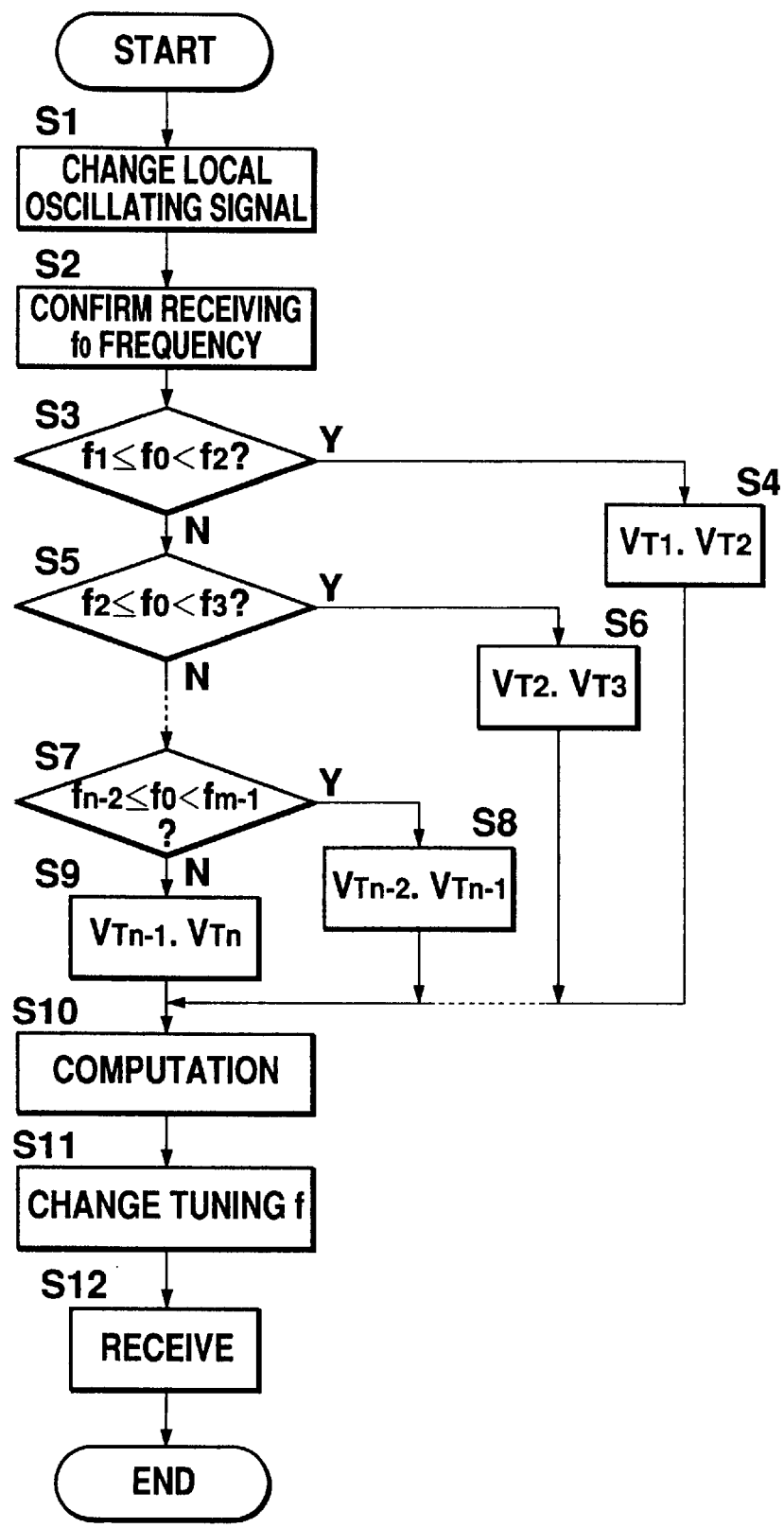
FIG. 3 is a flow chart depicting the operation of a radio receiver in an embodiment of the present invention.

Next, the operation when the receiving station changes from the first broadcasting station to a second broadcasting station will be explained using the flowchart shown in FIG. 3. A frequency divided data generating circuit (12) generates frequency divided data in compliance with a station-change signal applied at the terminal a of the frequency divided data generating circuit (12). A PLL circuit formed from a local oscillating circuit (4) and a PLL control circuit (8) then executes a PLL operation in compliance with the frequency divided data and the local oscillating circuit (4) generates a local oscillating signal. As a result of the change in the local oscillating frequency, the receiving frequency changes to the channel frequency of the second broadcasting station (S1). The frequency divided data is also applied to an arithmetic circuit (14) for generating a control signal. Since the frequency divided data corresponds to the local oscillating frequency, a determining circuit (15) computes a frequency f0 for the second broadcasting station in compliance with the frequency divided data (S2). The determining circuit (15) then determines whether or not the receiving frequency f0 lies between a frequency f1 and a frequency f2 which is higher than frequency f1. (S3)

When the receiving frequency f0 satisfies: $f1 \leq f0 < f2$, a reading circuit (16) reads control data Vt1 and Vt2 corresponding to frequencies f1 and f2 respectively from the storing circuit (17) based on the determination result of the determining circuit (15) (S4). When the receiving frequency f0 is not between frequency f1 and frequency f2, the determining circuit (15) further determines whether receiving frequency f0 lies between frequency f2 and frequency f3 which is higher than f2 (S5).

When the receiving frequency f0 satisfies: f2≦f0<f3, the reading circuit (16) reads control data Vt2 and Vt3 corresponding to frequencies f2 and f3 respectively from the storing circuit (17) based on the determination result of the determining circuit (15) (S6). When the receiving frequency f0 is not between frequencies f2 and f3, the determining circuit (15).further determines whether the receiving frequency f0 lies between a frequency fn–2 and a frequency fn–1 which is higher than fn–2 (S7) which constitute the next frequency range.

When the receiving frequency f0 satisfies: fn–2≦f0<fn–1, the reading circuit (16) reads control data Vtn–2 and Vtn–1 corresponding to frequencies fn–2 and fn–1 respectively from the storing circuit (17) based on the determination result of the determining portion (15) (S8). When the receiving frequency f0 is not between frequencies fn–2 and fn–1, the reading circuit (16) reads control data Vtn–1 and Vtn corresponding to frequencies fn–1 and fn respectively from the storing circuit (17) (S9).

Figure 4A:
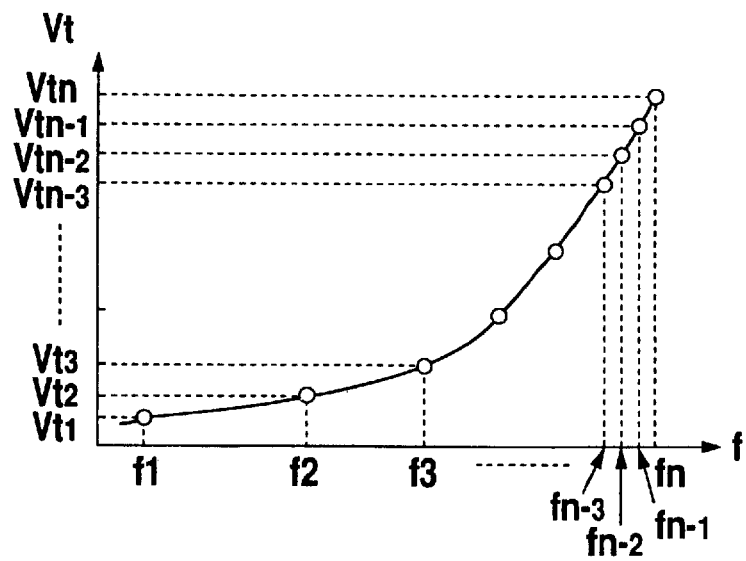
FIG. 4A is a diagram depicting the relationship between control data and tuning frequency in a tuning element of a radio receiver in an embodiment of the present invention.

The relationship between the receiving frequency f0 and the control data Vt is shown in FIG. 4A. As for instance is indicated by the circles in FIG. 4A, control data Vt stored in the storing circuit (17) have discontinuous control voltage at equal intervals across the entire receiving band and the corresponding frequency intervals are uneven.

Thereafter, an arithmetic circuit (14) computes a control signal for controlling the capacitance of the variable capacitance element (1a) in compliance with a second broadcasting station frequency f0 indicated by frequency divided data, the uppermost and lowermost frequencies of the frequency range in which the frequency f0 is situated and control data Vt respectively corresponding to the uppermost and lowermost frequencies. For instance, when the receiving frequency f0 lies within the range f1≦f0<f2, the arithmetic circuit (14) can determine a tuning frequency for the receiving frequency f0 using the uppermost and lowermost frequencies of the frequency range f1 and f2 and control data Vt1 and Vt2 corresponding to these frequencies according to the following equation (S10):

$$Vx = \frac{Vt2 - Vt1}{f2 - f1} \times (f0 - f1) + Vt1 \quad (1)$$

Figure 4B:
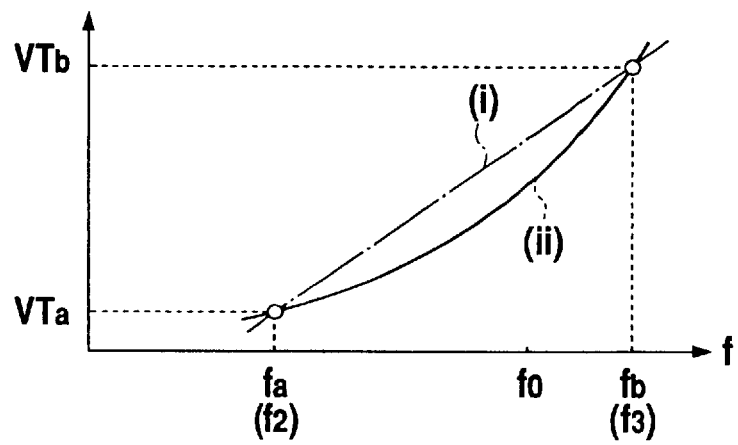
FIG. 4B is a diagram depicting the relation between control data and tuning frequency when capacitance has been controlled based on the control data of a radio receiver in an embodiment of the present invention.

Thus the control signal Vx is obtained by linearly approximating two of the data fa, fb in FIG. 4B according to the above equation (1) and the control signal Vx is placed over a straight line indicated by the chained line (i) in FIG. 4B. Furthermore, a control signal is obtained as an arbitrary point on the chained line (i) shown in FIG. 4B by considering the receiving frequency f0.

The line (ii) in FIG. 4B indicates one portion of the curve in FIG. 4A and the values of the control signal Vx determined using the equation (1) shown above approximate to the measured values indicated by the line (ii).

The control signal Vx generated from the arithmetic circuit (14) is analog-converted at a D/A converting circuit (18) and the capacitance of the variable capacity element (1a) is altered in compliance with a control voltage from the D/A converting circuit (18). As a result, the tuning frequency of the RF tuning circuit (1) is set almost equal to the receiving frequency f0 (S11). When the tuning frequency of the RF tuning circuit (1) is almost equal to the receiving frequency f0, the radio receiver is ready to receive the second broadcasting station.

In the above explanation, the determining circuit (15) determines whether or not the receiving frequency f0 is within a designated frequency range (for instance f1≦f0<f2). If f0 is determined to be within this range the reading circuit (16) respectively reads control data corresponding to the uppermost and lowermost frequencies from the storing circuit (17). However, since the relationship between the control data Vt and the frequency f at the variable capacitance element (1a) is fixed as described below (see FIG. 4A), determining whether or not the receiving frequency f0 is within a designated frequency range is technically the same as determining whether or not the corresponding data Vt0 is between two designated control data Vt. Therefore, the function of the determining circuit (15) need not be restricted to that in the explanation above. The determining circuit (15) can also directly determine whether data corresponding to the given receiving frequency f0 (for instance control data Vt0 corresponding to the frequency f0) is within a range defined by designated first and second control data corresponding with the lowermost and uppermost frequencies of the range in which the receiving frequency f0 lies.

Figure 4C:
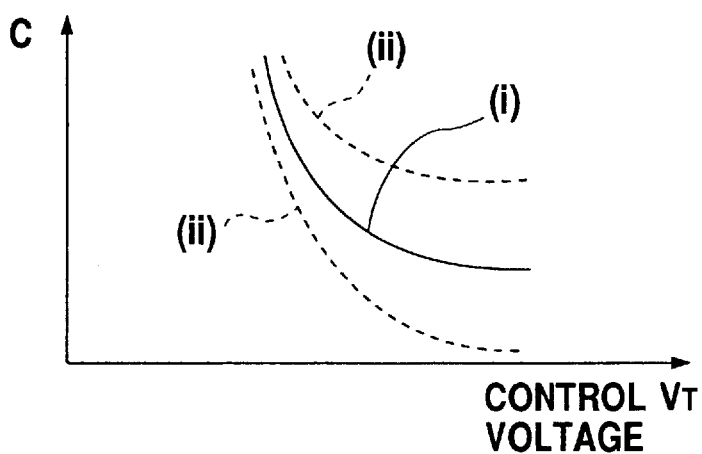
FIG. 4C is a diagram showing the relation between capacitance of a variable capacitance element and control voltage of a radio receiver in an embodiment of the present invention.

Control data Vt for controlling the variable capacitance element (1a) corresponding to a discontinuous frequency f as shown in FIG. 4A are stored in the storing circuit (17). The frequency f here is based on the capacitance of a variable capacitance element of the tuning element controlled by the control data Vt, in other words it is a tuning frequency. Though the control data Vt are at equal intervals, the corresponding frequencies f are set at unequal intervals. These frequency intervals are set wider in low frequency regions and narrower in high frequency regions. A varactor diode is generally used as the variable capacitance element (1a) of the RF tuning circuit (1). The line (i) in FIG. 4C depicts the change in the capacitance C of this varactor diode in relation to the control voltage VT by which it is controlled. In fact however, the capacitance C exhibits variation in relation to the control voltage VT as shown in FIG. 4C by the dotted lines (ii). As shown in FIG. 4C, variation in the frequency characteristics of the tuning element (namely variation in the capacitance of the varactor diode) decreases when the control voltage VT corresponding to control signal Vx is lower and increases when the control voltage VT is higher.

As a consequence, this variation caused the variation of the tuning frequency of the RF tuning circuit (1) and tuning frequency variation decreases when the control voltage is lower and increases when the control voltage is higher. Therefore, in order to obtain a control signal Vx0 corresponding to a control voltage value appropriate for controlling the frequency characteristics of the tuning element, in other words for controlling the capacitance of the varactor diode, in regions where capacitance variation of the variable capacitance element (1a) is great, the frequency intervals of the frequency corresponding to the control signal narrows as FIG. 4B shows. Therefore the difference between the actual capacitance and a closely approximated capacitance can be reduced. Tuning frequency variation of the RF tuning circuit (1) resulting from variation in the varactor diode can thus be reduced. Therefore, frequency intervals are set widely in the low frequency range and set narrowly in the high frequency range.

In the above explanation of FIG. 4A, the control data were set at equal intervals, but the control data can also be set at unequal intervals. In that case, setting should be such that the difference between the receiving sensitivity resulting from the control voltage obtained by equation (1) and the receiving sensitivity resulting from the actual control voltage of the varactor diode is less than 3dB.

The relationship between the control signal Vt0 obtained by computation and the tuning frequency corresponding to the capacitance of the varactor diode is a straight line which resembles the chained line (i) shown in FIG. 4B and not the line (ii) in the same diagram indicating the actual relationship. The difference in radio receiver receiving sensitivity between the receiving state when the capacitance of the varactor diode is controlled by control signal V×0 obtained by computation and the receiving state based on the actual capacitance of the varactor diode is set to a designated frequency in order that this difference in radio receiver receiving sensitivity is within 3 dB, thus ensuring that deterioration in receiving sensitivity does not adversely affect the radio receiver apparatus. Since the actual relationship between the control signal V×0 and the tuning frequency can be known from experience or by measuring the varactor diode, it is therefore easy to set the corresponding relation between designated control data and the designated frequency as shown in FIG. 4A for example. Thus 6~8 data are stored by the storing circuit as the control data. Furthermore, in a case in which, though there are basically no errors in the control signal of the variable capacity element, errors occur in the showing data and the like of the storing circuit (17) and the desired control signal for the variable capacitance element cannot be obtained, a fine-tuning circuit can be provided as in a conventional example, and wherein fine-tuning can be carried out after the control signal has been applied and the tuning frequency of the RF tuning circuit can be tuned until it is almost equal to the receiving frequency.

Figure 5:
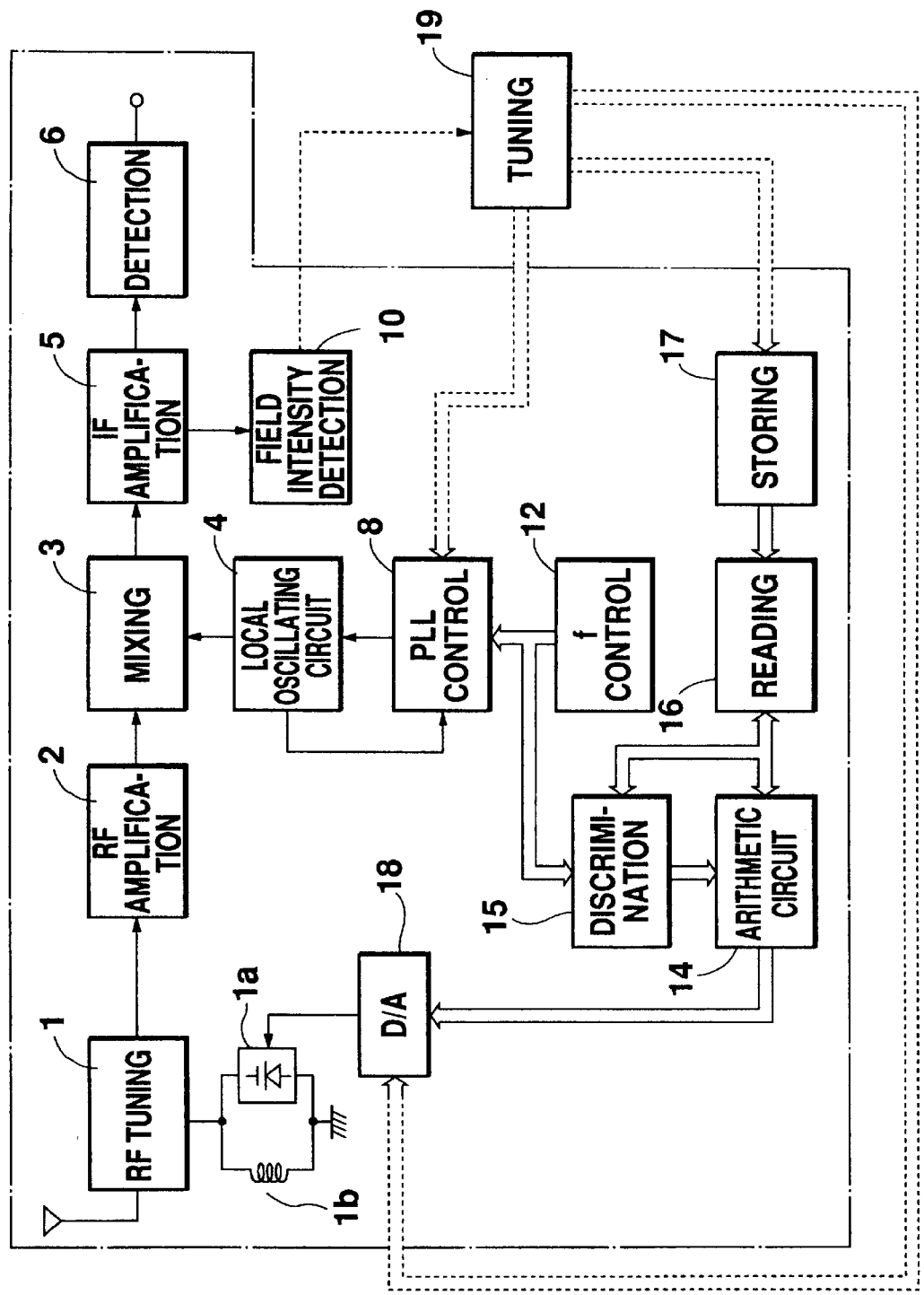
FIG. 5 is diagram depicting a configuration when tuning is carried out for a radio receiver in an embodiment of the present invention.

Storing of control data in the storing circuit (17) is carried out in a tuning process during manufacture of the radio receiver apparatus. During tuning, a tuning circuit (19) is connected to the radio receiver apparatus indicated by the chained line in FIG. 5. Generally, radio receivers have a field intensity detecting circuit (10) for detecting receiving field intensity and when a tuning circuit (19) has been connected, the output signal of the field intensity detecting circuit (10) is applied to the tuning circuit (19).

Figure 6:
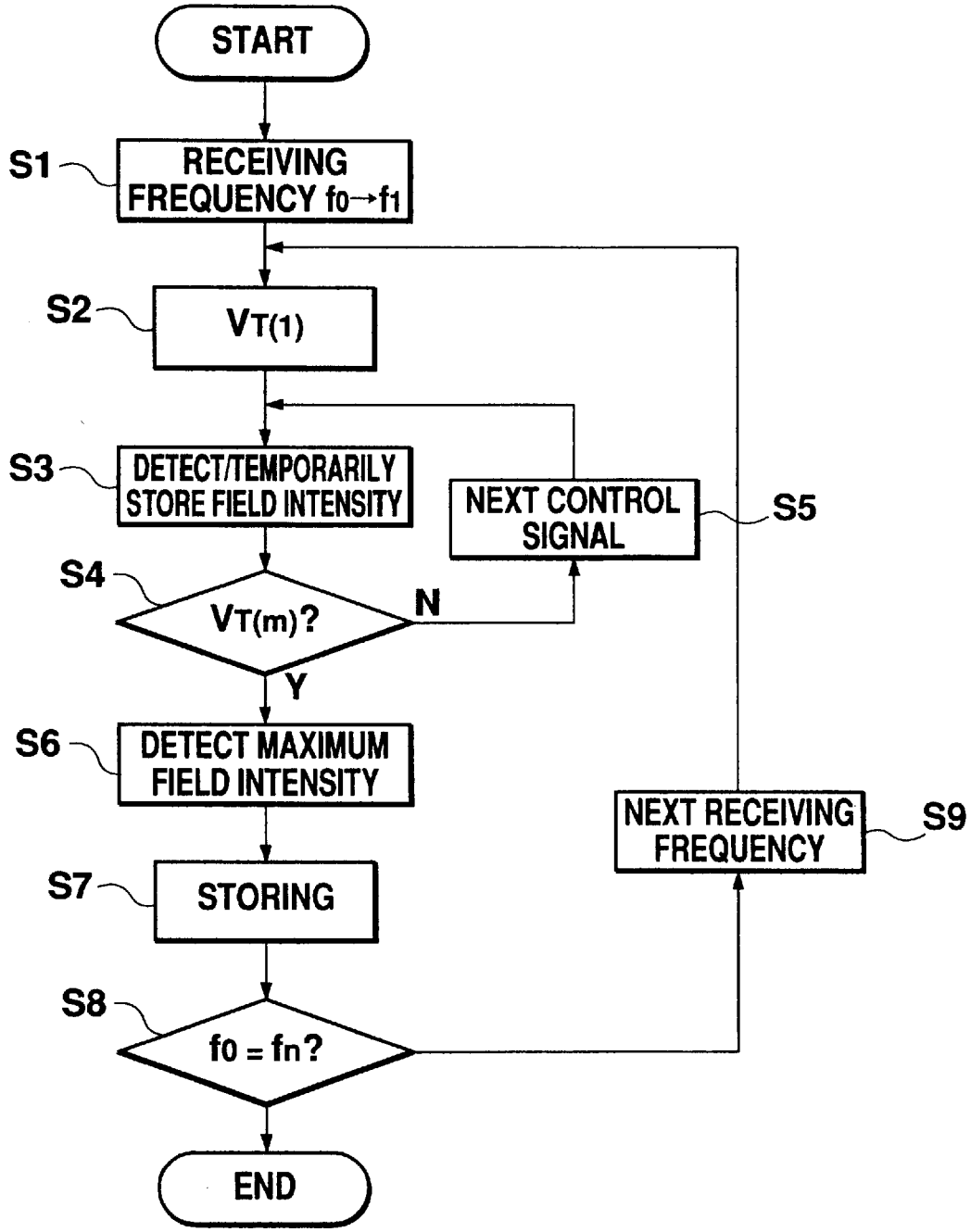
FIG. 6 is a flow chart depicting the operation when tuning is carried out for a radio receiver in an embodiment of the present invention.

The storing operation when storing control data in a storing circuit (17) during tuning of the radio receiver apparatus will next be explained with reference to the flowchart shown in FIG. 6. After the tuning circuit (19) has been connected, when a signal of a frequency f0 is applied to the radio receiver, first frequency divided data is applied to the PLL control circuit (8) from the tuning circuit (19) and the radio receiver can then receive the frequency f0 receiving signal (S1). Thereafter, the tuning circuit (19) generates the first control data Vt' (1) as regulating control data to the D/A converting circuit (18) which analog-converts the data and the tuning frequency of the RF tuning circuit (1) is set in compliance with an output signal from the D/A converting circuit (18) (S2). In this state, the field intensity detecting circuit (10) detects receiving field intensity in compliance with an output signal from the IF amplifying circuit (5), an output signal from the field intensity detecting circuit (10) is applied to the tuning circuit (19) and data indicating the field intensity and control data Vt' are temporarily stored in a RAM within the tuning circuit (19) (S3). It is then determined in the tuning circuit (19) whether or not the control data Vt' is the final control data Vt (m) (S4). When the control data is not the final control data Vt (m), the control data is changed to the next control data increased by 1 bit and applied to the D/A converting circuit (18) by the tuning circuit (19). The tuning frequency of the RF tuning circuit (1) is then changed in compliance with an output signal from the D/A converting circuit (18) (S5). The receiving field intensity in this new receiving state is then detected and data indicating the field intensity and control data corresponding thereto are temporarily stored in the RAM. Thereafter, control signal bits are increased one by one until the control data reaches the final control data Vt (m). In other words, receiving field intensity data and control data are temporarily stored in the RAM each time the tuning frequency of the RF tuning circuit (1) is fine-tuned. When the final control data Vt (m) is reached, the tuning circuit (19) detects the greatest receiving field intensity from the receiving field intensities stored in the RAM (S6). From the RAM, the tuning circuit (19) reads out control data corresponding to the greatest receiving field intensity and stores this regulating control data Vt'max as the control data Vt and data indicating a receiving frequency f1 in the storing circuit (17) (S7). The storing circuit (17) is comprised of a non-volatile memory. The tuning circuit (19) further determines whether or not the receiving frequency is the final receiving frequency fn (S8). If the receiving frequency is not the final receiving frequency fn, the receiving frequency is changed to the next frequency. Consequently, the signal of the next frequency is applied to the radio receiver and the radio receiver is set to the receiving state for receiving the next receiving frequency (S9). While changing the control data, the tuning circuit (19) detects the receiving field intensities, selects the greatest receiving field intensity among them and stores control data corresponding to the greatest receiving field intensity and data indicating the receiving signal frequency in the storing circuit (17) (S2~S7). If the receiving frequency is the final receiving frequency fn, the storing operation of the control data is completed and so the tuning circuit (19) is detached from the radio receiver and the tuning operation ends. Receiving frequencies applied to the radio receiver have discontinuous values such as those shown in FIG. 4A.

The above explanation has described an AM radio receiver, but the technology of the present application can also be used in a radio receiver such as an FM radio receiver in which tracking errors are generated.

As described above, since according to the present invention a control signal of a variable tuning element corresponding to the desired broadcasting station is computed using the frequency of the desired broadcasting station, an uppermost value and a lowermost value of a frequency range within which the frequency of the desired broadcasting station lies and the control data for the variable capacitance element corresponding to the uppermost and lowermost values are stored in a storing circuit, the variable capacitance element can be quickly controlled. Since the only necessary processes are the determining of the broadcasting station, reading out of control data and computation of a control signal, a control signal for the variable capacitance element is obtained in just 5 msec. Moreover, since control data used in the computation of a control signal respectively comply with each of a variable capacitance element, there is no need to select a variable capacitance element. There is no deterioration in radio receiver sensitivity since the RF tuning circuit tuning frequency is controlled within the entire receiving band by computing a control signal of the variable capacitance element.

While there has been described what is at present considered to be a preferred embodiment of the invention, it will be understood that various modifications may be made to the present invention and it is intended that the appended claims cover all such modifications as fall within the true spirit and scope of the invention.

What is claimed is:

1. A radio receiver comprising:

an RF tuning circuit including a tuning element having a variable frequency characteristic in order to set tuning frequencies:

a mixing circuit for converting a signal outputted from the RF tuning circuit to an IF signal by means of a local oscillating signal:

a local oscillating circuit for generating the local oscillating signal;

a frequency control circuit for controlling of the local oscillating signal in response to a select signal:

a storing circuit for storing control data corresponding to the frequency characteristic of the tuning element; and an arithmetic unit for carrying out a computation based on the control data and data corresponding to the select signal and generating a control signal, wherein the frequency characteristic of the tuning element is controlled by the control signal from the arithmetic unit to the tuning element, and when regulating for the radio receiver, a signal at a designated frequency is supplied to the radio receiver, while regulating control data are finely tuned, receiving field intensities in the radio receiver corresponding respectively to the regulating control data are detected, and from these are selected one regulating control data which obtains the greatest receiving field intensity, and then the selected regulating control data is stored in the storing circuit as the control data, and data spaces between each of the control data are set at narrower interval as variation in the frequency characteristic of the tuning element becomes wider.

2. A radio receiver comprising:

an RF tuning circuit including a tuning element having a variable frequency characteristic in order to set tuning frequencies;

a mixing circuit for converting a signal outputted from the RF tuning circuit to an IF signal by means of a local oscillating signal;

a local oscillating circuit for generating the local oscillating signal;

a frequency control circuit for controlling of the local oscillating signal in response to a select signal;

a storing circuit for storing control data corresponding to the frequency characteristic of the tuning element; and an arithmetic unit for carrying out a computation based on the control data and data corresponding to the select signal and generating a control signal, wherein the frequency characteristic of the tuning element is controlled by the control signal from the arithmetic unit to the tuning element, and when regulating for the radio receiver, a signal at a designated frequency is supplied to the radio receiver, while regulating control data are finely tuned, receiving field intensities in the radio receiver corresponding respectively to the regulating control data are detected, and from these are selected one regulating control data which obtains the greatest receiving field intensity, and then the selected regulating control data is stored in the storing circuit as the control data, and frequency spaces between the tuning frequencies are set at narrower intervals as variation in the frequency characteristics of the tuning element becomes wider.

3. A radio receiver comprising:

an RF tuning circuit including a tuning element having a variable frequency characteristic in order to set tuning frequencies;

a mixing circuit for converting a signal outputted from the RF tuning circuit to an IF signal by means of a local oscillating signal;

a local oscillating circuit for generating the local oscillating signal;

a frequency control circuit for controlling of the local oscillating signal in response to a select signal;

a storing circuit for storing control data corresponding to the frequency characteristic of the tuning element; and an arithmetic unit for carrying out a computation based on the control data and data corresponding to the select signal and generating a control signal, wherein the frequency characteristic of the tuning element is controlled by the control signal from the arithmetic unit to the tuning element, and data spaces between each of the control data are set at narrower intervals as variation in the frequency characteristics of the tuning element becomes wider.

4. A radio receiver according to claim 3, wherein the arithmetic unit comprises:

a determining circuit for determining whether data corresponding to the select signal is between a first control data stored in the storing circuit and a second control data which is greater than the first control data and is stored in the storing circuit; and an arithmetic circuit for determining the control signal in response to the first control data, the second data and the select signal, wherein the control signal controls the RF tuning circuit and represents a value determined as being between the first control data and the second control.

5. A radio receiver according to claim 4, wherein the tuning element consists of an inductor element and a variable capacitance element and tunes in response to the select signal by controlling the capacitance in compliance with the control signal supplied from the arithmetic unit.

6. A radio receiver according to claim 3, wherein the tuning element consists of an inductor element and a variable capacitance element; and the tuning element executes tuning to correspond to the select signal by controlling the capacitance value in compliance with the control signal supplied from the arithmetic unit.

7. A radio receiver comprising:

an RF tuning circuit including a tuning element having a variable frequency characteristic in order to set tuning frequencies;

a mixing circuit for converting a signal outputted from the RF tuning circuit to an IF signal by means of a local oscillating signal;

a local oscillating circuit for generating the local oscillating signal;

a frequency control circuit for controlling of the local oscillating signal in response to a select signal;

a storing circuit for storing control data corresponding to the frequency characteristic of the tuning element; and an arithmetic unit for carrying out a computation based on the control data and data corresponding to the select signal and generating a control signal, wherein the frequency characteristic of the tuning element is controlled by the control signal from the arithmetic unit to the tuning element, and frequency spaces between the tuning frequencies are set at narrower intervals as variation in the frequency characteristics of the tuning element becomes wider.

8. A radio receiver according to claim 7, wherein the arithmetic unit comprises:

a determining circuit for determining whether data corresponding to the select signal is between a first control data stored in the storing circuit and a second control data which is greater than the first control data and is stored in the storing circuit; and an arithmetic circuit for determining the control signal in response to the first control data, the second data and the select signal, wherein the control signal controls the RF tuning circuit and represents a value determined as being between the first control data and the second control data.

9. A radio receiver according to claim 7, wherein the tuning element consists of an inductor element and a variable capacitance element; and the tuning element executes tuning to correspond to the select signal by controlling the capacitance value in compliance with the control signal supplied from the arithmetic unit.

10. A radio receiver comprising:

an RF tuning circuit including a tuning element having variable capacitance in order to set tuning frequencies;

a mixing circuit for converting a signal outputted from the RF tuning circuit to an IF signal by means of a local oscillating signal;

a local oscillating circuit for generating the local oscillating signal;

a frequency control circuit for controlling the local oscillating signal in response to a select signal;

a storing circuit for storing control data, each one of the control data corresponding to a discrete frequency point, the control data corresponding to frequency characteristic based on a capacitance value of the tuning element and being used to control the tuning element of the RF tuning circuit to tune the RF signal; and an arithmetic unit for carrying out a computation based on the control data corresponding to the select signal and data corresponding to the select signal and generating a control signal to control the tuning circuit, wherein the capacitance value of the tuning element is controlled by applying the control signal from the arithmetic unit to the tuning element and data spaces between each of the control data or frequency spaces between the tuning frequencies are set at narrower intervals as variation in the frequency characteristics of the tuning element becomes wider.

* * * * *